(12) United States Patent
Shibuya et al.

(10) Patent No.: US 7,197,613 B2
(45) Date of Patent: Mar. 27, 2007

(54) NONVOLATILE MEMORY

(75) Inventors: Hirofumi Shibuya, Matsuda (JP);
Fumio Hara, Higashikurume (JP);
Hiroyuki Goto, Higashimurayama (JP);
Shigemasa Shiota, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 343 days.

(21) Appl. No.: 10/721,086

(22) Filed: Nov. 26, 2003

(65) Prior Publication Data
US 2004/0158775 A1    Aug. 12, 2004

(30) Foreign Application Priority Data
Jan. 28, 2003    (JP)    ............... 2003-018296

(51) Int. Cl.
*G06F 12/12*    (2006.01)
(52) U.S. Cl. ............ 711/156; 711/100; 711/104; 711/105; 711/154; 711/165; 711/170
(58) Field of Classification Search ............ 711/156, 711/100, 104, 105, 154, 165, 170
See application file for complete search history.

(56) References Cited

U.S. PATENT DOCUMENTS 5,991,517 A * 11/1999 Harari et al. ............ 714/3
6,496,947 B1 * 12/2002 Schwarz .................. 714/30
7,024,614 B1 * 4/2006 Thelin et al. ............ 714/770
2003/0169630 A1 * 9/2003 Hosono et al. ............ 365/200

FOREIGN PATENT DOCUMENTS

JP    3-191450    8/1991

* cited by examiner

*Primary Examiner*—Stephen C. Elmore
*Assistant Examiner*—Daniel Kim
(74) *Attorney, Agent, or Firm*—Miles & Stockbridge P.C.

(57) ABSTRACT

It is aimed to detect, notify, and save an abnormal area in semiconductor memory for greatly improving reliability. An inside of semiconductor memories provided for a memory card comprises a user area, a substitution area, an area substitution information storage area, and a management area. An inside of semiconductor memories comprises a user area, a substitution area, and a management area. The user area is a data area a user can use. The substitution area is substituted when an error occurs in the user area. The area substitution information storage area stores area substitution area information. The management area stores substitution information. The information processing section performs substitution on two levels as follows. When detecting an operation indicating a symptom of failure in a semiconductor memory area, the information processing section performs area substitution during an idle state of the memory card. When detecting a faulty operation in an area, the information processing section immediately performs area substitution.

10 Claims, 16 Drawing Sheets

FIG. 4

[STATUS FLAG]
00h: NORMAL (UNUSED)
01h: NORMAL (USED)
08h: AREA SUBSTITUTION COMPLETED; SUBSTITUTION ORIGIN
09h: AREA SUBSTITUTION COMPLETED; SUBSTITUTION DESTINATION
0Ah: AREA SUBSTITUTION COMPLETED AFTER BEING USED AS A SUBSTITUTE AREA; SUBSTITUTION ORIGIN
0Bh: AREA SUBSTITUTION COMPLETED AFTER BEING USED AS A SUBSTITUTE AREA; SUBSTITUTION DESTINATION
0Ch: IDLE COMPLETED; SUBSTITUTION ORIGIN
0Dh: IDLE COMPLETED; SUBSTITUTION DESTINATION
0Eh: IDLE COMPLETED AFTER BEING USED AS A SUBSTITUTE AREA; SUBSTITUTION ORIGIN
0Fh: IDLE COMPLETED AFTER BEING USED AS A SUBSTITUTE AREA; SUBSTITUTION DESTINATION
21h: EMERGENT STATE OCCURRED (LIMIT EXCEEDED)
31h: EMERGENT STATE OCCURRED (LIMIT EXCEEDED) AFTER BEING USED AS A SUBSTITUTE AREA
81h: IDLE OCCURRED (CRITICAL VALUE EXCEEDED)
82h: IDLE IN PROCESS; SUBSTITUTION ORIGIN
83h: IDLE IN PROCESS; SUBSTITUTION DESTINATION
C1h: IDLE OCCURRED (CRITICAL VALUE EXCEEDED) AFTER BEING USED AS A SUBSTITUTE AREA
C2h: IDLE IN PROCESS AFTER BEING USED AS A SUBSTITUTE AREA; SUBSTITUTION ORIGIN
C3h: IDLE IN PROCESS AFTER BEING USED AS A SUBSTITUTE AREA; SUBSTITUTION DESTINATION
FFh: SUBSTITUTE AREA EXHAUSTED

[SUBSTITUTION FACTOR]
SEE FIG. 5

[SUBSTITUTION ORIGIN]
PHYSICAL AREA NUMBER OF AREA SUBSTITUTION ORIGIN

[SUBSTITUTION DESTINATION]
PHYSICAL AREA NUMBER OF AREA SUBSTITUTION DESTINATION

FIG. 5

| AREA SUBSTITUTION FACTOR | | SUBSTITUTION FACTOR VALUE | LIMIT VALUE | CRITICAL VALUE | RETRY REQUIRED ? |
|---|---|---|---|---|---|
| SUBSTITUTE FREE AREA | | 1h | 0 | 20 BLOCKS OR LESS | — |
| SUCCESSIVE RETRY ERROR | SUCCESSIVE PROGRAM ERROR | 2h | 260 TIMES OR MORE | 10 TIMES OR MORE | REQUIRED |
| | EXCESSIVE WRITE ERROR | 3h | 260 TIMES OR MORE | 10 TIMES OR MORE | REQUIRED |
| | RETENTION FAILURE (VERIFY CHECK ERROR) | 4h | 260 TIMES OR MORE | 10 TIMES OR MORE | REQUIRED |
| ECC UNCORRECTABLE ERROR AT RETENTION FAILURE | | 5h | ONCE | — | — |
| DEVICE/MANUFACTURE CODE UNREADABLE ERROR | | 6h | ONCE | — | — |
| PHYSICAL AMOUNT | ERASURE/PROGRAM TIME | 7h | 100ms | 10ms | — |
| | NUMBER OF ERASURES | 8h | 1M TIMES | 300K TIMES | — |
| | READ CURRENT VALUE | 9h | 1.2A OR MORE | 700mA OR MORE | — |
| | WRITE CURRENT VALUE | Ah | 1.5A OR MORE | 1.0A OR MORE | — |
| | EXTERNALLY SUPPLIED POWER/CURRENT VALUE | Bh | 3A OR MORE | 1.5A OR MORE | — |

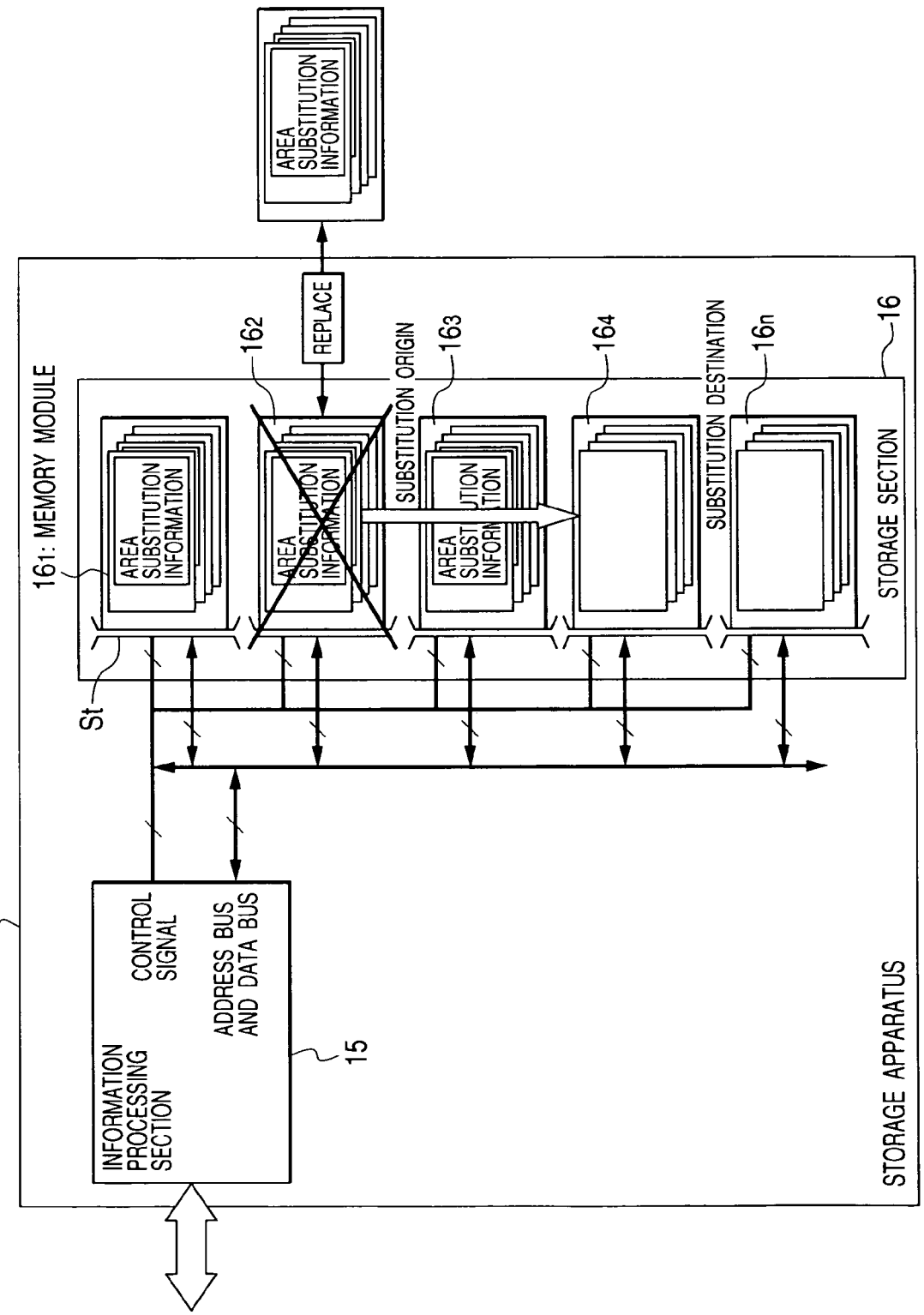

NONVOLATILE MEMORY

BACKGROUND OF THE INVENTION

The present invention relates to a technology for improving reliability of a storage device. More specifically, the present invention relates to a technology effectively applied to data saving in a storage device comprising nonvolatile semiconductor memory.

Memory cards have rapidly spread as a storage device for personal computers and multifunctional terminals. With increasing demands for high performance in recent years, for example, flash memory is used as semiconductor memory installed in a memory card. The flash memory is capable of electrically erasing and rewriting data and storing a large amount of data without using a battery.

When the semiconductor memory malfunctions, some memory cards allow the faulty semiconductor memory to be replaced by an alternative semiconductor memory for preventing the memory card from being unusable (e.g., see patent document 1).

[Patent Document 1]
Japanese Unexamined Patent Publication No. Hei 3(1991)-191450

SUMMARY OF THE INVENTION

However, the inventors found the following problem in the above-mentioned technology as a countermeasure against faulty memory cards.

That is to say, the problem is incapability to ensure data at faulty locations. This is because of the ex-post countermeasure of replacing the failed semiconductor memory with an alternative semiconductor memory instead of replacing the semiconductor memory to become faulty with an alternative semiconductor memory in advance.

It is therefore an object of the present invention to provide a storage device capable of detecting, notifying, and saving an abnormal area in semiconductor memory and greatly improving the reliability.

These and other objects and novel features of the invention may be readily ascertained by referring to the following description and appended drawings.

The following outlines major aspects of the present invention disclosed in this application.

A storage device according to the present invention comprises one or more semiconductor memories and an information processing section which reads data stored in the one or more semiconductor memories based on an operating program and instructs a predetermined process and an operation to write data. The information processing section detects a state of an area in the semiconductor memory. The information processing section substitutes the area during an idle state causing no operations in the storage device when the area is assumed to be a critical state. The information processing section substitutes the area immediately when the area is assumed to be a limit state.

BRIEF DESCRIPTION OF THE DRAWINGS

FIG. 4 is an explanatory diagram exemplifying status flags and contents thereof in the area substitution table stored in the area substitution information storage area of the semiconductor memory in FIG. 1;

FIG. 5 is an explanatory diagram exemplifying area substitution factors for area substitution information in FIG. 4;

FIG. 16 is a block diagram of the storage device according to another embodiment of the present invention.

DETAILED DESCRIPTION OF THE PREFERRED EMBODIMENTS

Embodiments of the present invention will be described in further detail with reference to the accompanying drawings.

Figure 1:
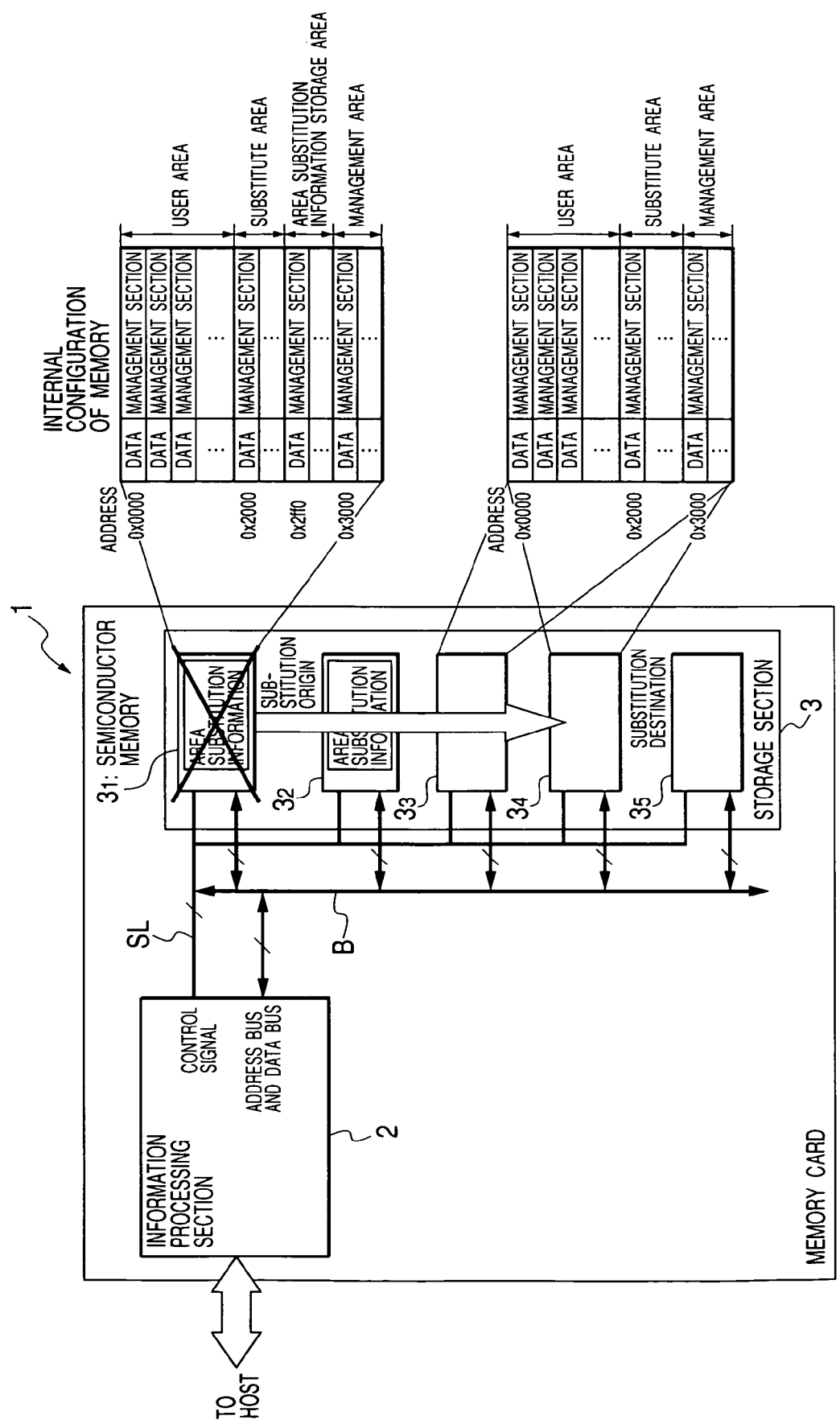
FIG. 1 is a block diagram of a memory card according to an embodiment of the present invention.
Figure 2:
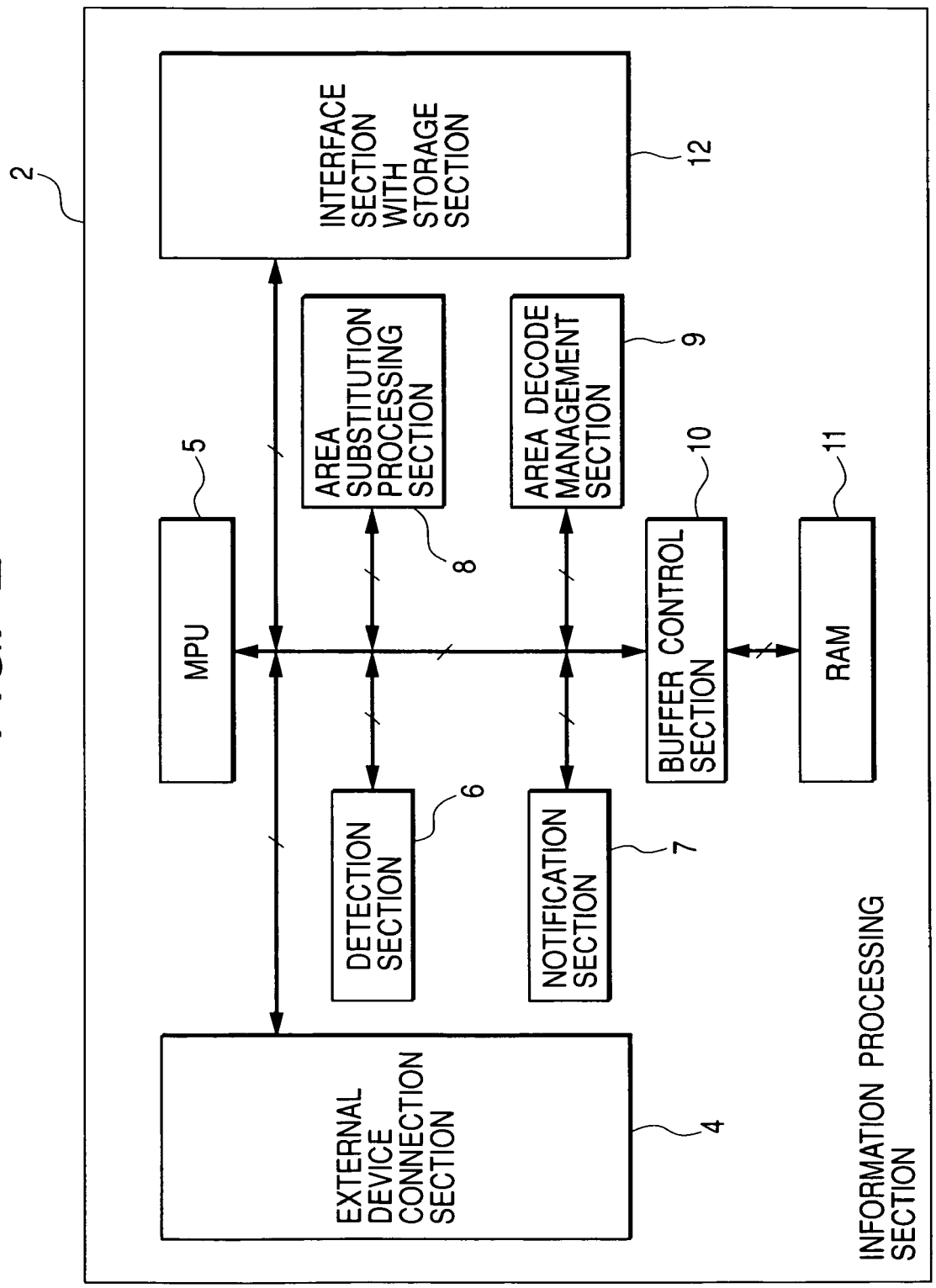
FIG. 2 is a block diagram of an information processing section provided for the memory card in FIG. 1.
Figure 3:
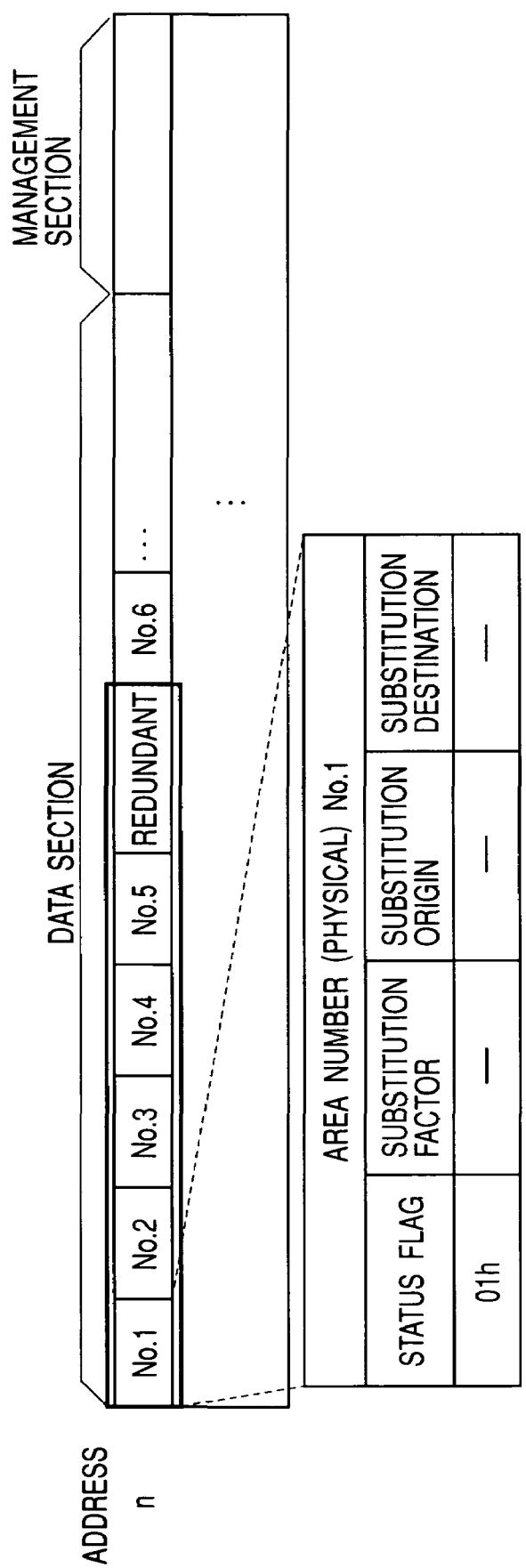
FIG. 3 is a configuration diagram of an area substitution table stored in each area substitution information storage area of the semiconductor memory provided for the memory card in FIG. 1.
Figure 6:
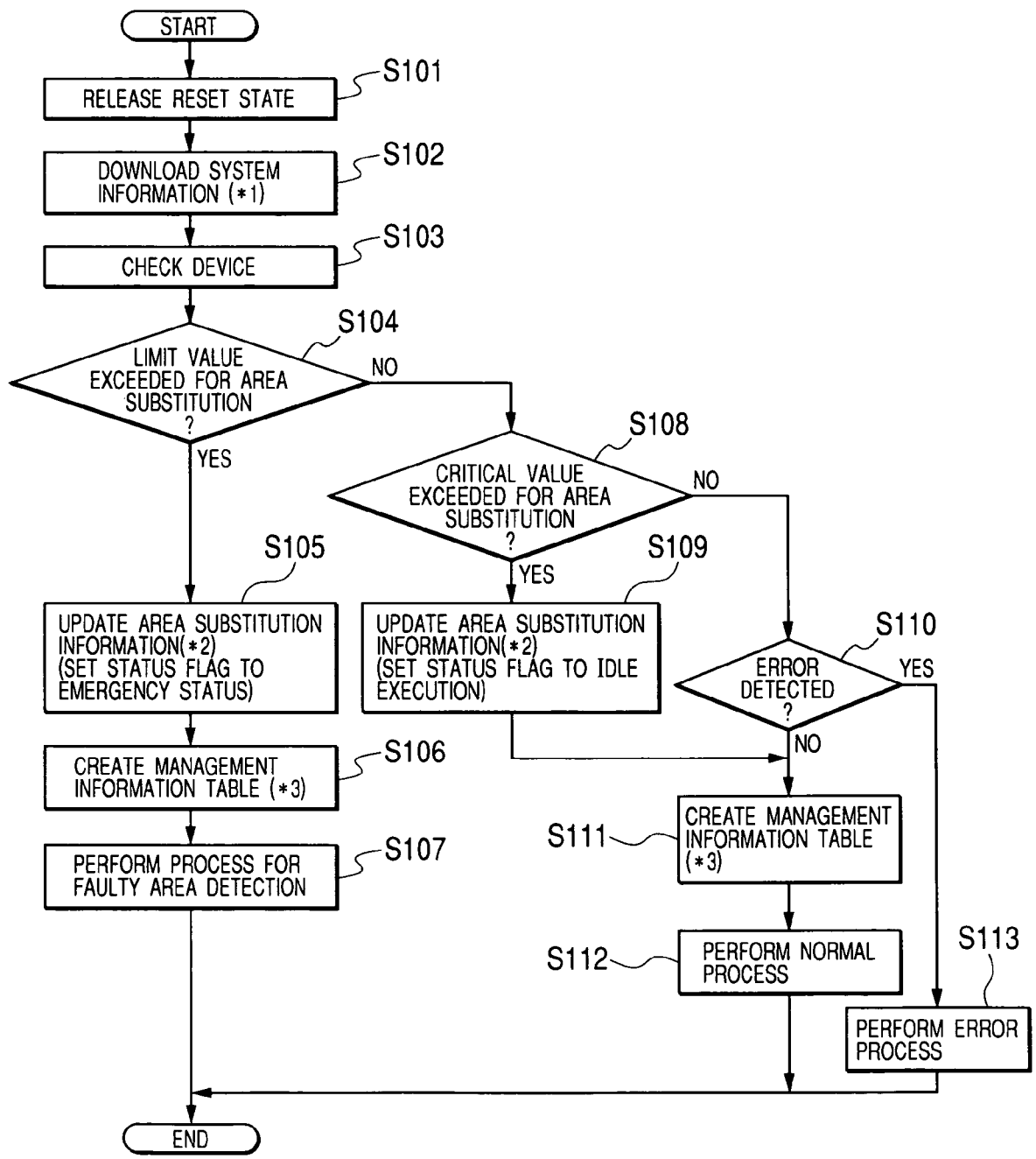
FIG. 6 is a flowchart describing a reset process and an initialization process after a power-on sequence for the memory card in FIG. 1.
Figure 7:
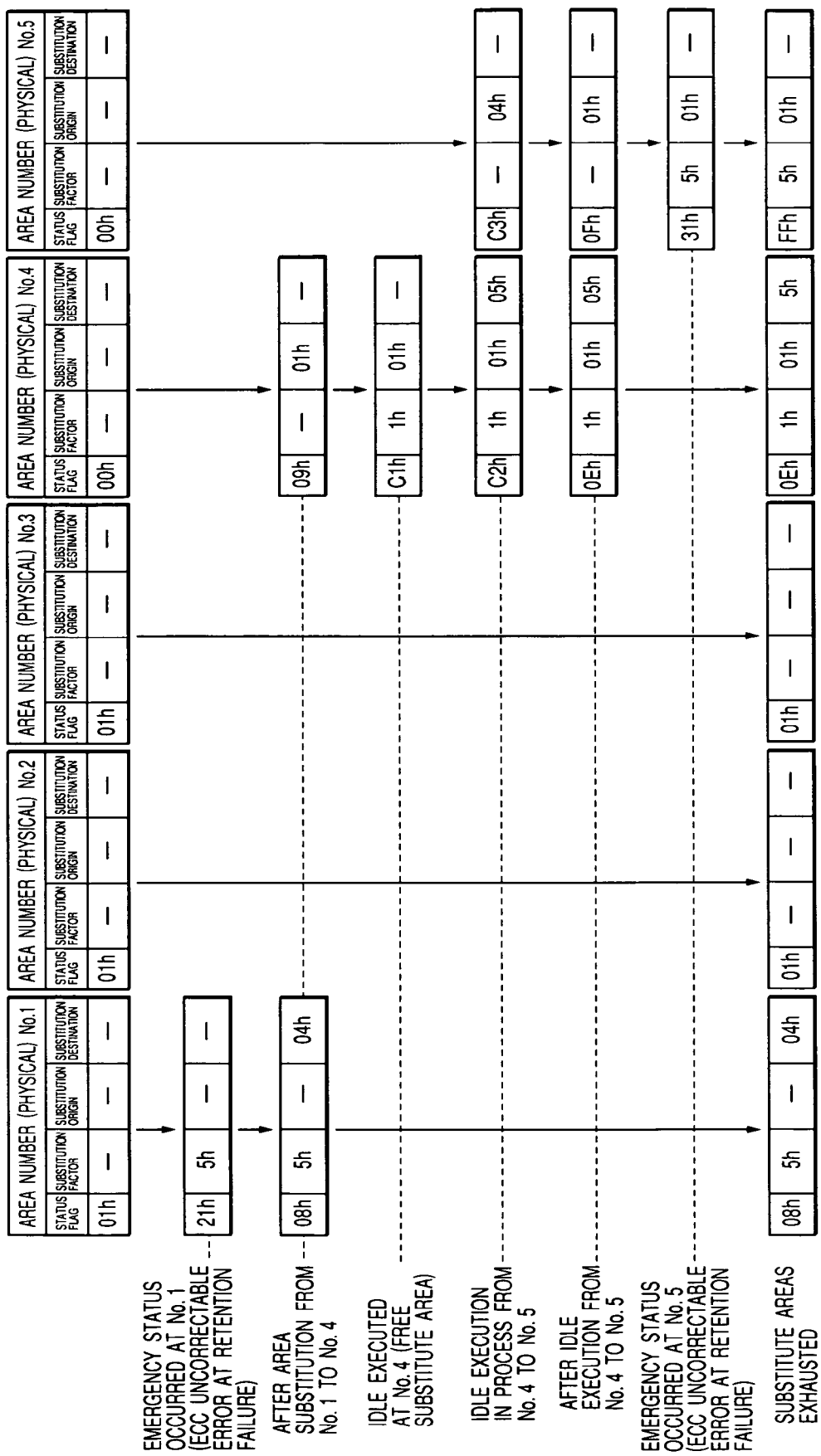
FIG. 7 is an explanatory diagram for state transition in the area substitution table stored in an MPU work area provided for the memory card in FIG. 1.
Figure 8:
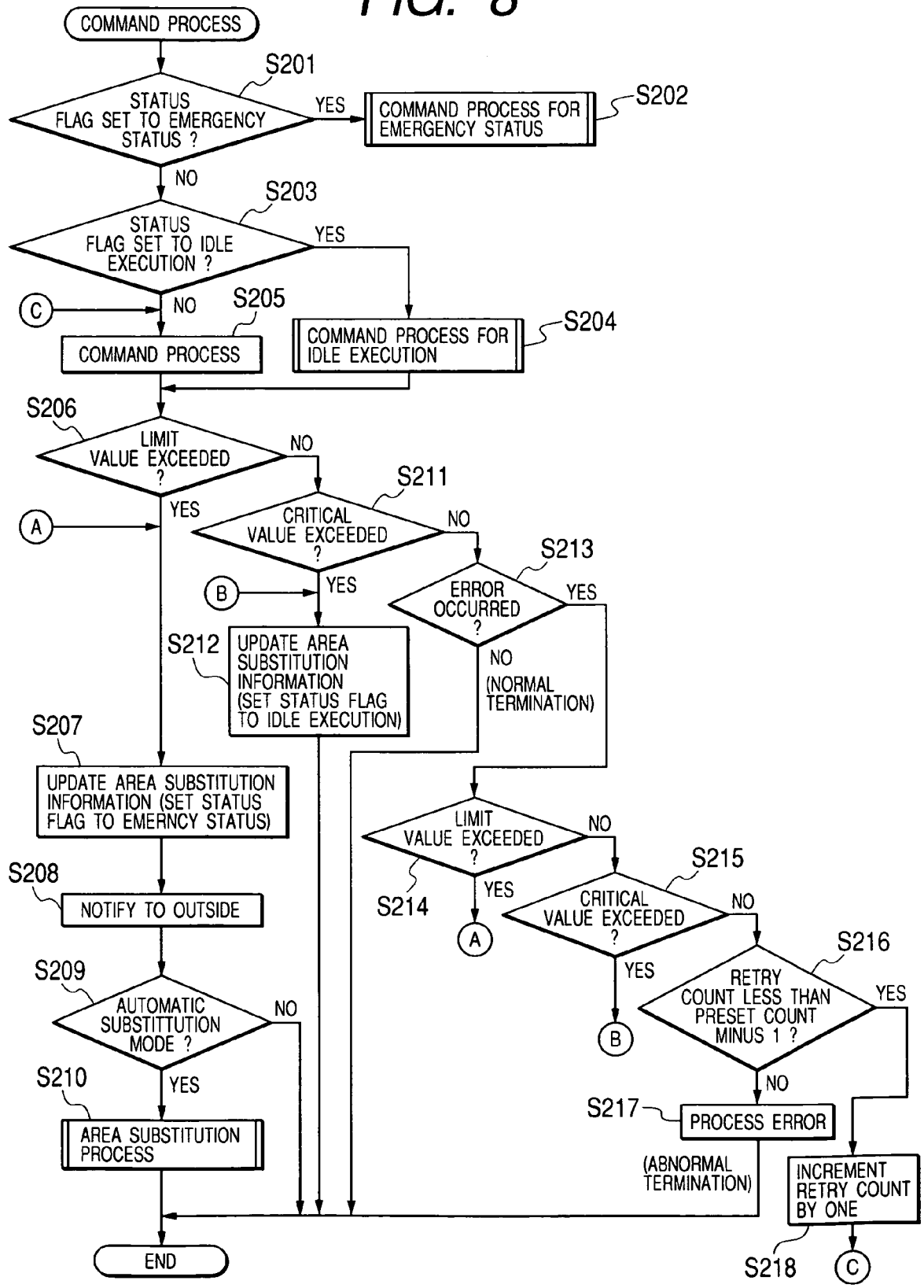
FIG. 8 is a flowchart describing a command process for the memory card in FIG. 1.
Figure 9:
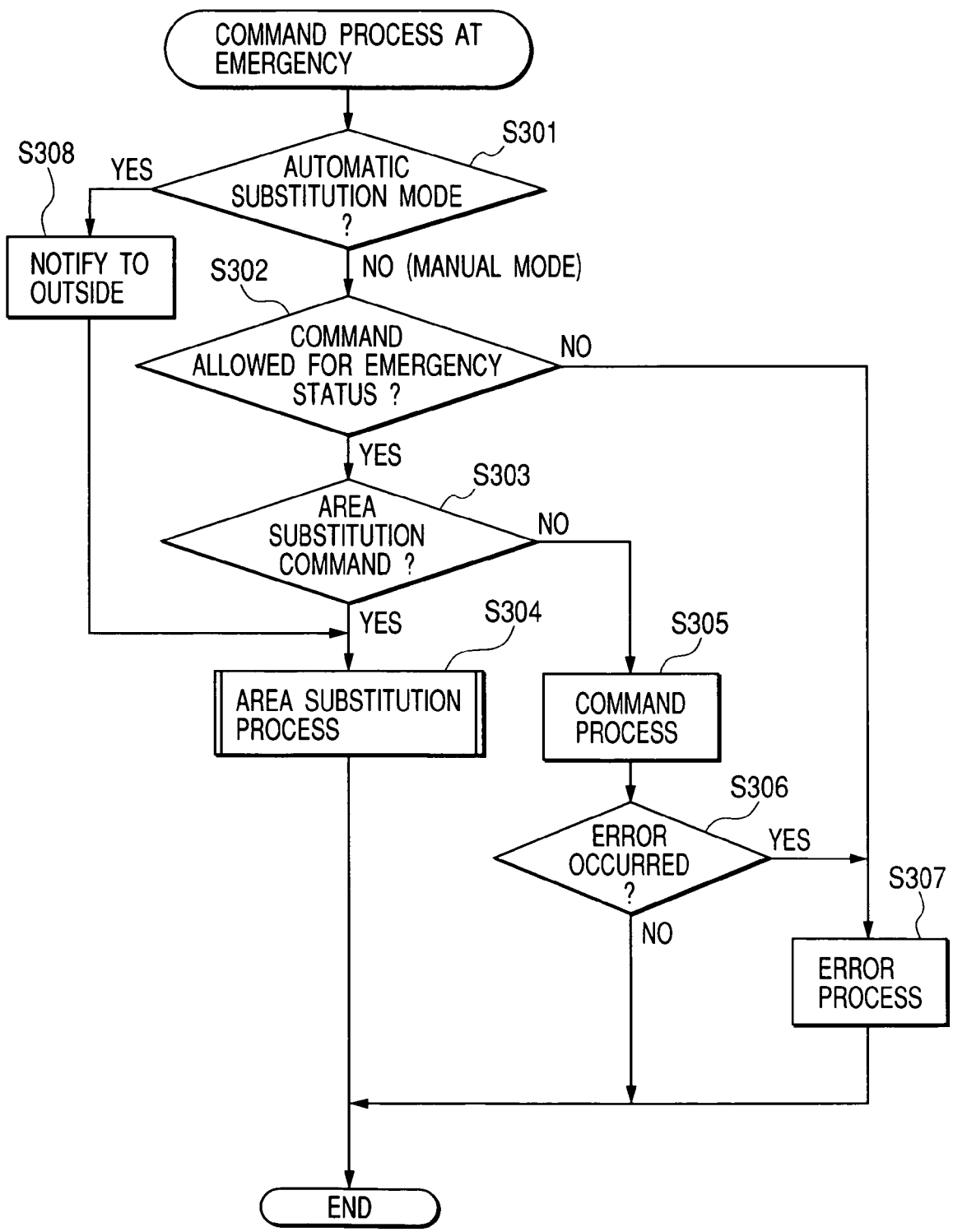
FIG. 9 is a flowchart describing a command process for the memory card in an emergency condition in FIG. 1.
Figure 10:
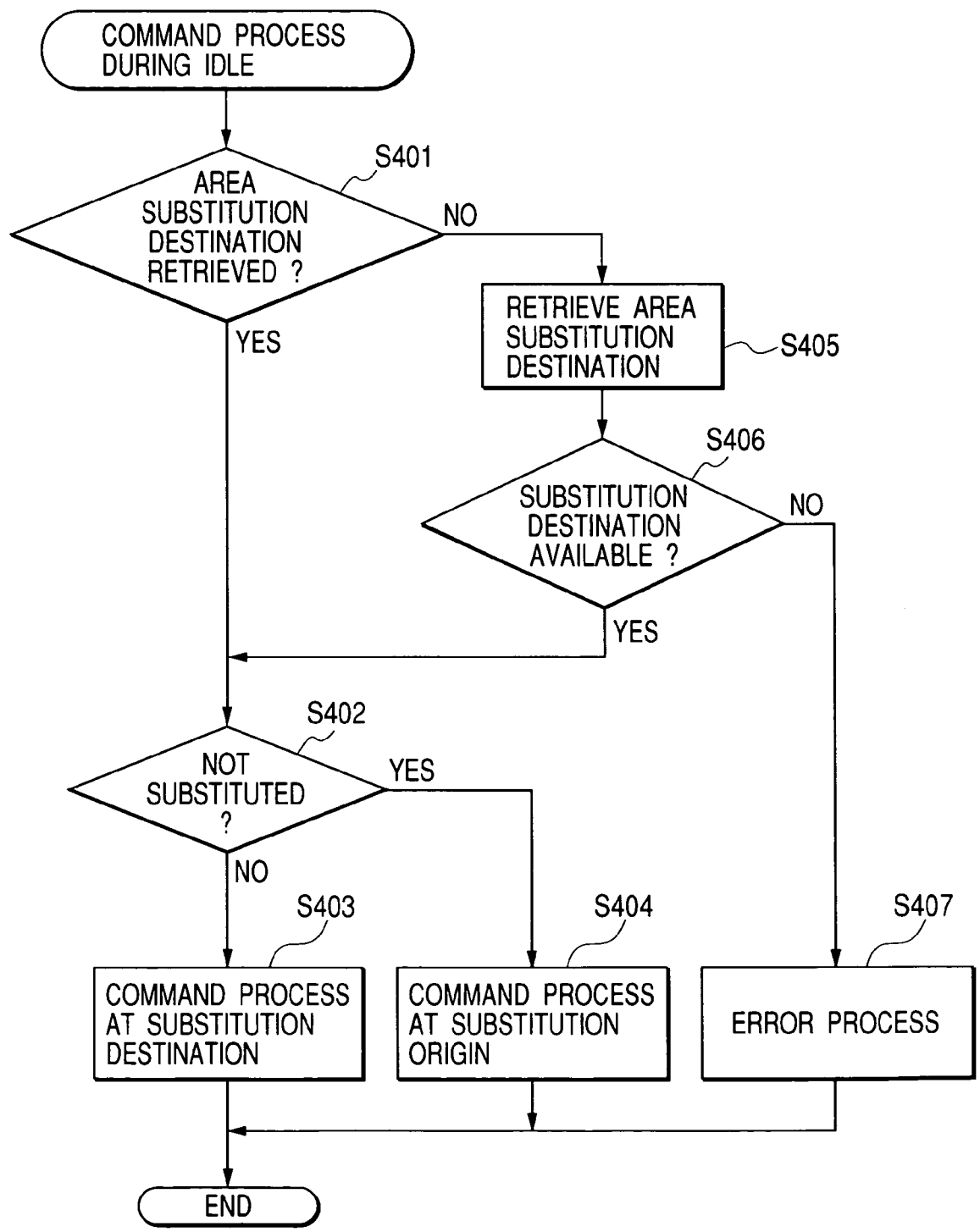
FIG. 10 is a flowchart describing a command process during IDLE execution for the memory card in FIG. 1.
Figure 11:
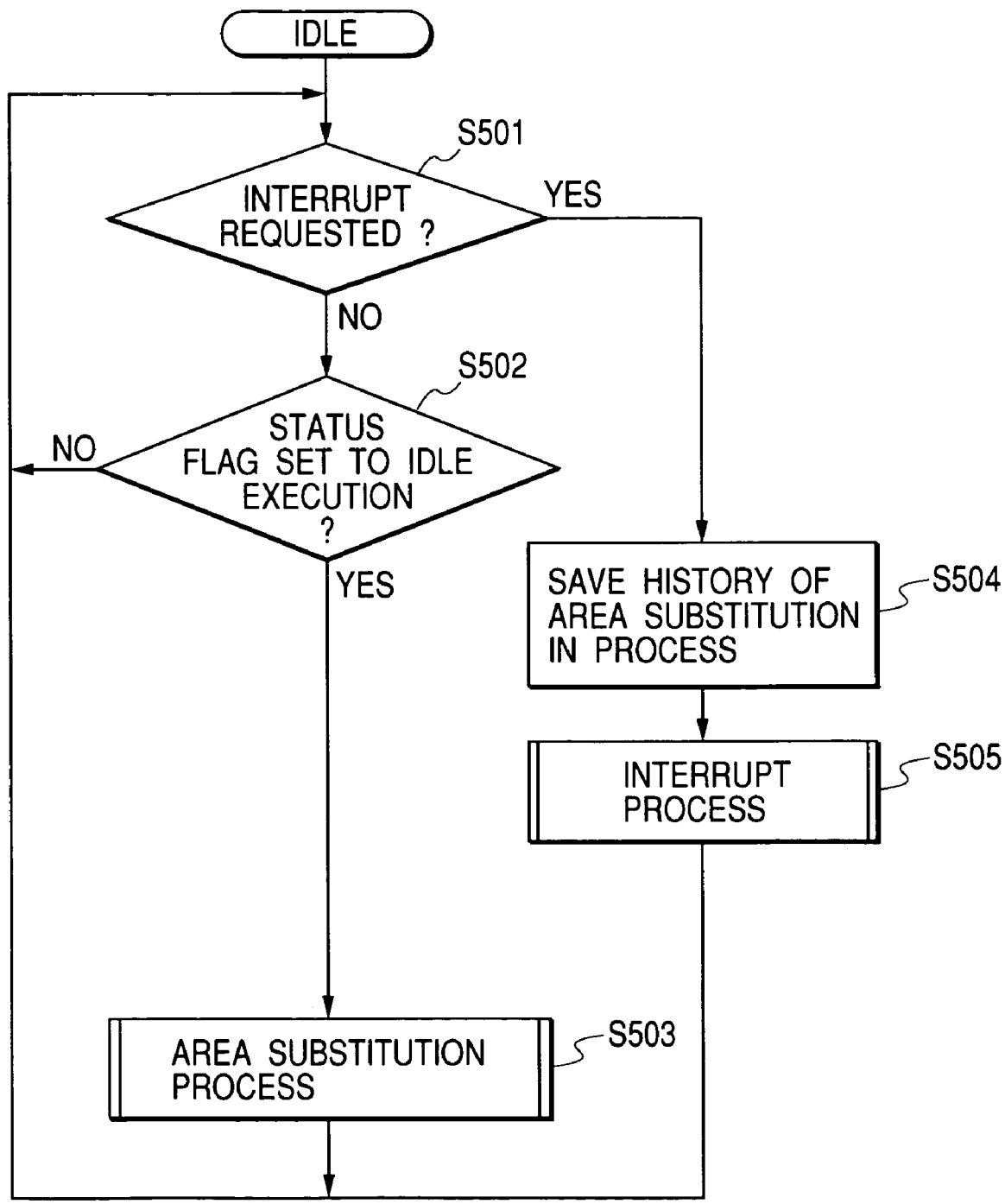
FIG. 11 is a flowchart describing an IDLE execution process for the memory card in FIG. 1.
Figure 12:
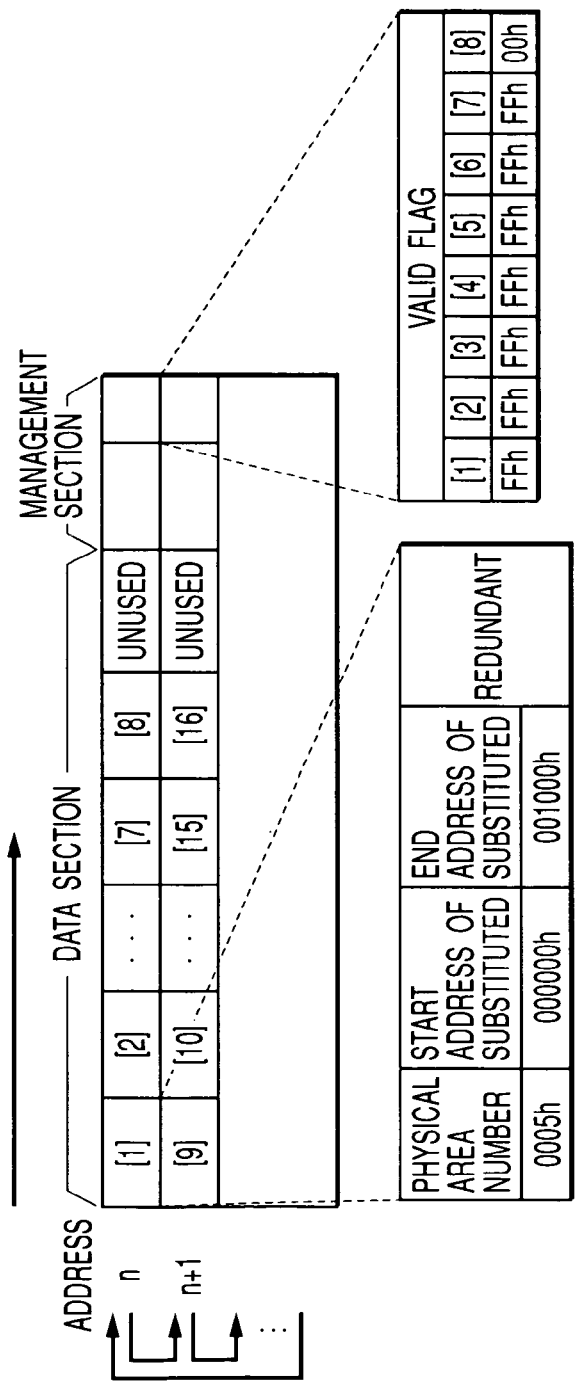
FIG. 12 an explanatory diagram for the area substitution in-process history of the memory card in FIG. 1.
Figure 13:
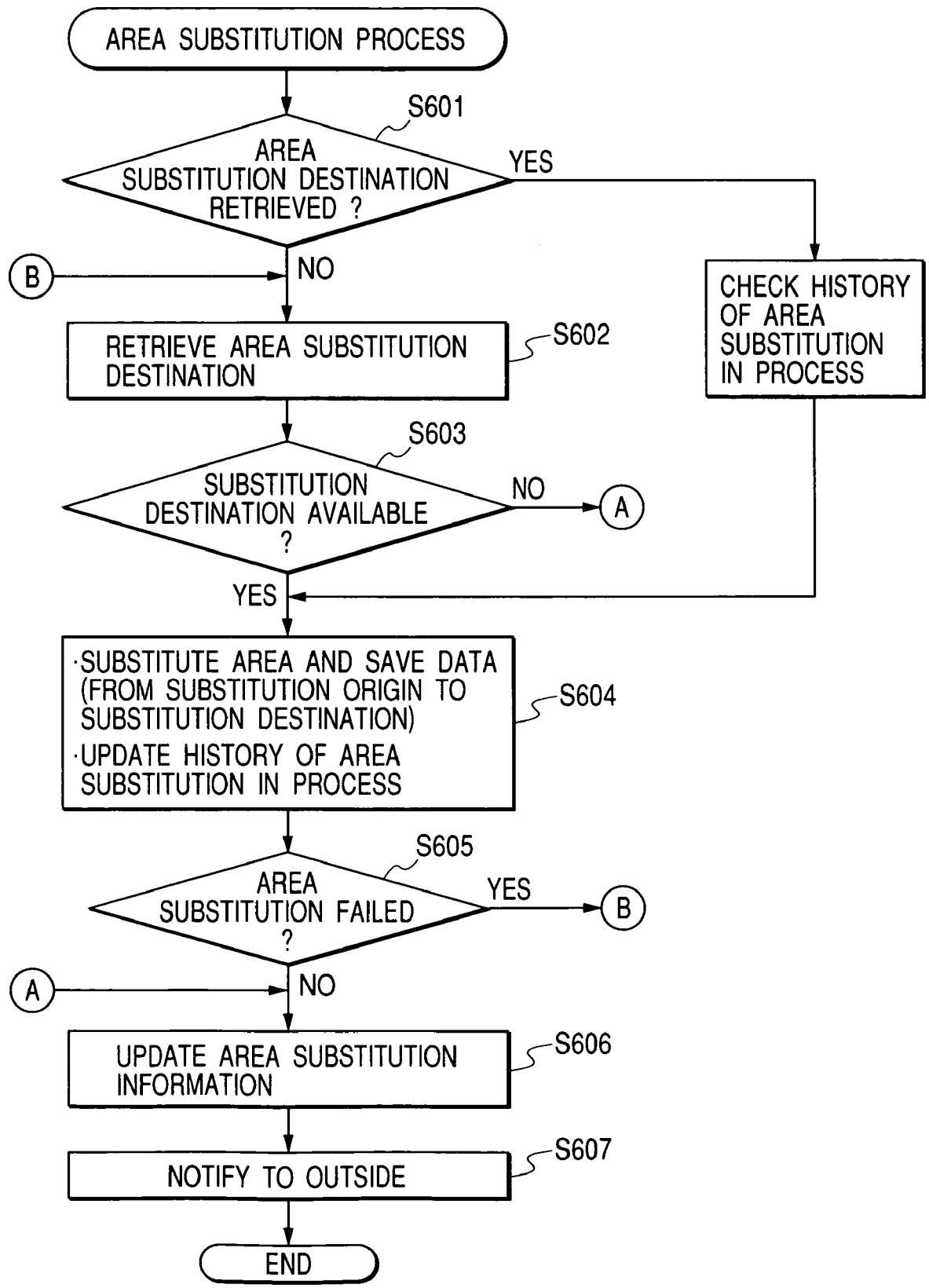
FIG. 13 is a flowchart describing an area substitution for the memory card in FIG. 1.

FIG. 1 is a block diagram of a memory card according to an embodiment of the present invention. FIG. 2 is a block diagram of an information processing section provided for the memory card in FIG. 1. FIG. 3 is a configuration diagram of an area substitution table stored in each area substitution information storage area of the semiconductor memory provided for the memory card in FIG. 1. FIG. 4 is an explanatory diagram exemplifying status flags and contents thereof in the area substitution table stored in the area substitution information storage area of the semiconductor memory in FIG. 1. FIG. 5 is an explanatory diagram exemplifying area substitution factors for area substitution in FIG. 4. FIG. 6 is a flowchart describing a reset process and an initialization process after a power-on sequence for the memory card in FIG. 1. FIG. 7 is an explanatory diagram for state transition in the area substitution table stored in an MPU work area provided for the memory card in FIG. 1. FIG. 8 is a flowchart describing a command process for the memory card in FIG. 1. FIG. 9 is a flowchart describing a command process for the memory card in an emergency condition in FIG. 1. FIG. 10 is a flowchart describing a command process during IDLE execution for the memory card in FIG. 1. FIG. 11 is a flowchart describing an IDLE execution process for the memory card in FIG. 1. FIG. 12 an explanatory diagram for the area substitution in-process history of the memory card in FIG. 1. FIG. 13 is a flow chart describing an area substitution for the memory card in FIG. 1.

According to the embodiment, a memory card (storage device) 1 represents, e.g., a flash memory card and is used as an external storage medium for personal computers and multifunctional terminals as hosts.

The host just needs to access data using predetermined protocols such as ATA (AT Attachment), CF, and SCSI (Small Computer System Interface).

As shown in FIG. 1, the memory card 1 comprises an information processing section 2 and a storage section 3. The storage section 3 comprises, e.g., five semiconductor memories $3_1$ through $3_5$. For example, the semiconductor memories $3_1$ through $3_5$ comprise flash memories.

The information processing section 2 and the semiconductor memories $3_1$ through $3_5$ are connected to each other via a data/address bus B and a signal line bus SL.

The information processing section 2 reads programs or data stored in the semiconductor memories $3_1$ through $3_5$ based on an operating program for performing predetermined processes and instructing to write data. In addition, the information processing section 2 detects an abnormal area in the storage section 3 and notifies or saves it.

Each area will be described below.

Each of the semiconductor memories $3_1$ through $3_5$ is provided with a memory mat comprising a plurality of sectors. There is provided a control section to control the memory mat. The control section comprises an individual control section (individual peripheral circuit) to control a specific sector and a common control section to provide control irrespective of sector locations.

In this case, the memory mat employs a unit area, i.e., an area (physical area) controlled by each individual control section. Consequently, performing an area substitution enables substitution including the individual control section.

Instead of the above-mentioned area setting, one area may correspond to each semiconductor memory, or a bank if the semiconductor memory is provided with a plurality of banks.

The following describes the circuit configuration of the information processing section 2.

As shown in FIG. 2, the information processing section 2 comprises an external device connection section 4, an MPU 5, a detection section 6, a notification section 7, an area substitution processing section 8, an area decode management section 9, a buffer control section 10, RAM (Random Access Memory) 11, and an interface section 12.

According to this configuration, the information processing section 2 is provided with such functional blocks as the detection section 6, the notification section 7, the area substitution processing section 8, and the area decode management section 9. Instead of providing the information processing section 2 with the functional blocks, however, the MPU 5 may implement the equivalent functions by means of software processing, for example.

The external device connection section 4, the MPU 5, the detection section 6, the notification section 7, the area substitution processing section 8, the area decode management section 9, the buffer control section 10, the RAM 11, and the interface section are connected to each other via internal buses.

The external device connection section 4 works as an interface with the host. Based on operating programs, the MPU (Microprocessing Unit) 5 not only reads programs and data stored in the semiconductor memories $3_1$ through $3_5$ to perform predetermined processes, but also instructs to write data.

The detection section 6 detects an abnormal area. Based on a result detected by the detection section 6, the notification section 7 notifies occurrence of the abnormal area to the host and the like. The area substitution processing section 8 controls substitution processing of the abnormal area.

The area decode management section 9 is responsible for management such as allowing or disallowing access to any area. The buffer control section 10 controls the RAM 11. The RAM 11 is memory used as a data buffer for temporarily storing data of the storage section 3. The interface section 12 functions as an interface with the storage section 3.

The following describes the internal configuration of the semiconductor memories $3_1$ through $3_5$.

As shown in FIG. 1, the semiconductor memories $3_1$ and $3_2$ comprise a user area, a substitution area, an area substitution information storage area, and a management area. The semiconductor memories $3_3$ through $3_6$ comprise a user area, a substitution area, and a management area.

The user area is a data area a user can use. The substitution area substitutes for the user area if it fails. The area substitution information storage area stores area substitution area information. The management area stores substitution information for managing the substitution area.

The semiconductor memories $3_1$ and $3_2$ each are provided with the area substitution information storage area for ensuring data by multiplexing. The area substitution information storage area can be provided for not only the semiconductor memories $3_1$ and $3_2$, but also any or all of the semiconductor memories $3_3$ through $3_5$ for more safely maintaining data.

FIG. 3 shows a configuration of the area substitution table to be store in each area substitution information storage area of the semiconductor memories $3_1$ and $3_2$.

The area substitution table comprises a status flag, a substitution factor, a substitution origin, and a substitution destination. The status flag indicates a substitute area state. FIG. 4 exemplifies status flags in the area substitution table and contents of the status flags. As shown in FIG. 4, the area substitution table provides various contents such as "Normal (unused)", "Normal (used)", and "Area substitution completed; substitution origin" corresponding to the status flags.

The substitution factor shows the cause of area substitution. The substitution origin shows a physical area number of a substitution origin. The substitution destination shows a physical area number of a substitution destination.

The area substitution table is formed correspondingly to each of areas (area Nos. 1 through 5) for the semiconductor memories $3_1$ through $3_5$. A unit of five area substitution tables is provided with a redundant area for form one set.

The redundant area is used to add an ECC (Error Correcting Code) redundant code that protects data. The redundant area may be omissible.

FIG. 5 exemplifies area substitution factors.

FIG. 5 shows, from the left to the right, an area substitution factor, and a flag, a limit value, a critical value, and necessity of a retry process corresponding to the contents of the area substitution factor.

The area substitution factor includes: a substitute free area indicating the number of blocks for a free area in the semiconductor memory; a successive retry error; an ECC uncorrectable error at retention failure; a Device/Manufacture Code unreadable error (device code error); and a physical amount.

The successive retry error includes: a successive program error; an overwrite error; and a retention failure (verify check error). The physical amount includes: an erasure/program time; the number of erasures; a read current value; a write current value; and an externally supplied power/current value.

Each of the area substitution factors is assigned the limit value and the critical value. The limit value (limit state) indicates that the area is unusable and needs to be substituted immediately. The critical value (critical state) indicates that the area is usable but is critical, requiring gradual substitution.

As an area substitution factor, for example, the 'successive program error' of the 'successive retry error' is assigned the limit value set to 260 or more and the critical value set to 10 or more.

The following describes operations of the memory card 1 according to the embodiment.

First, a flowchart in FIG. 6 is used to describe a reset process and an initialization process after a power-on sequence for the memory card 1.

The power is turned on to release the reset state (step S101). The system information in the semiconductor memories $3_1$ through $3_5$ is downloaded to work areas such as RAM provided for the MPU 5 (step S102).

The MPU 5 references the area substitution information stored in the area substitution information storage area of the semiconductor memory $3_1$ (or the semiconductor memory $3_2$) and downloads the system information except the faulty semiconductor memory.

Thereafter, the detection section 6 performs a device check for the semiconductor memories $3_1$ through $3_5$ in the storage section 3 (step S103). The detection section 6 then checks whether or not the limit value for area substitution is exceeded (step S104).

When the limit value for area substitution is exceeded at step S104, the area decode management section 9 sets the status flag to indicate an emergency condition and updates the area substitution information in the work area of the MPU 5 (step S105). This allows the status flag in the area substitution table to indicate occurrence of an emergency condition (see FIG. 4).

Based on the updated area substitution information, the MPU 5 creates a management information table (step S106) and stores it in the work area of the MPU 5. The MPU 5 then performs a process for faulty area detection (step S107).

When the limit value for area substitution is not exceeded at step S104, the detection section 6 checks whether or not the critical value for the area substitution is exceeded (step S108).

When the critical value is exceeded, the area decode management section 9 updates the area substitution information (step S109) so that the status flag in the area substitution table indicates occurrence of the IDLE execution (FIG. 4).

When the critical value is not exceeded at step S108, the MPU 5 checks whether or not an error occurs in the semiconductor memory (step S110). If no error occurs, the MPU creates the management information table (step S111) and stores in the work area thereof to execute normal processing (step S112).

When an error occurs in the process at step S110, the MPU 5 executes an error process (step S113).

FIG. 7 diagrams state transition in the area substitution table stored in the work area of the MPU 5 due to the area substitution. Here, it is assumed that area numbers No. 1 through No. 3 are busy and that area numbers No. 4 and No. 5 correspond to substitute areas.

In FIG. 7, the area substitution table stored in the work area is equivalent to the configuration of the area substitution table in FIG. 3 except the redundant area. The remaining part of the configuration is unchanged, i.e., comprising the status flag, the substitution factor, the substitution origin, and the substitution destination.

For example, when an ECC unrecoverable error occurs due to faulty retention in the area with area number No. 1, the area substitution table for area number No. 1 will contain the status flag set to '21h' (FIG. 4) and the substitution factor set to '5h' (FIG. 5).

When the area with area number No. 1 is substituted for that with area number No. 4, the area substitution table for area number No. 1 will contain the status flag set to '08h' (FIG. 4) indicating completion of the area substitution and the substitution destination set to '04h' indicating the area number of the substitution destination.

The area substitution table for area number No. 4, will contain the status flag set to '09h' (FIG. 4) indicating completion of the area substitution and the substitution origin set to '01h' indicating the area number of the substitution origin.

When the detection section 6 detects that the critical value exceeds in the substitute free area with area number No. 4, the area substitution table for area number No.4 will contain the status flag set to 'C1h' (FIG. 4) and the substitution factor set to '1h' (FIG. 5).

Here, the area with area number No. 4 is substituted for that with area number No. 5. The area substitution is performed during an idle time of the memory card 1. That is to say, the area substitution is performed in the background during an idle state in which no process takes place. The following description uses the term "IDLE execution" to express that the semiconductor memory executes the area substitution during an idle state.

During an IDLE execution period, the area substitution table for area number No. 4 will contain the status flag set to 'C2h' (FIG. 4) indicating the IDLE execution in process and the substitution destination set to '05h' indicating the area number of the substitution destination.

The area substitution table with area number No. 5 will contain the status flag set to 'C3h' (FIG. 4) indicating the IDLE execution in process and substitution origin set to '04h' indicating the area number of the substitution origin.

When the area substitution terminates thereafter, the area substitution table with area number No. 4 will contain the status flag set to '0Eh' (FIG. 4) indicating completion of the IDLE execution. The area substitution table with area number No. 5 will contain the status flag set to '0Fh' (FIG. 4) indicating completion of the IDLE execution.

When the substituted area number No. 5 is subject to an emergency condition (an ECC uncorrectable error due to faulty retention), the area substitution table for area number No. 5 will contain the status flag set to '31h' (FIG. 4) and the substitution factor set to '5h' (FIG. 5).

In this case, the area numbers Nos. 4 and 5 are already used as substitute areas. Accordingly, the area substitution table for area number No. 5 will contain the status flag set to 'FFh' (FIG. 4) indicating substitute area exhaustion, i.e., termination of the substitution.

The following describes operations of a command process in the memory card 1 with reference to a flowchart in FIG. 8.

When a command is input from the outside such as a host, the detection section 6 checks the status flag in the area substitution table (step S201) to determine whether or not the status flag indicates the emergency condition of critical value exceeded. The emergency condition occurs when any of area substitution factors in FIG. 5 indicates the limit value. When the emergency condition occurs, the detection section 6 executes a command process for the emergency condition (step S202).

When no emergency condition occurs, the detection section 6 determines whether or not the status flag (FIG. 4) indicates the IDLE execution in process (step S203). When the IDLE execution in process is determined at step S203, the detection section 6 executes a command process for IDLE execution (step S204). When the IDLE execution in process is not determined at step S203, the detection section 6 processes the externally input command (step S205).

At step S204 or S205, the detection section 6 checks whether or not any of the area substitution factors in FIG. 5 exceeds the limit value (step S206).

When the limit value is exceeded, the area decode management section 9 updates the area substitution table for area substitution information (step S207) so that the status flag is set to indicate the emergency condition. Then, the notification section 7 notifies the outside such as the host that the emergency condition takes effect (step S208). The MPU 5 determines whether or not an automatic substitution mode is enabled (step S209). When the automatic substitution mode is enabled, the area substitution is executed (step S210) to terminate the process.

When it is determined at step S209 that the automatic substitution mode is not enabled, the area substitution is performed according to an instruction of the area substitution command input from the outside such as the host.

When it is determined at step S206 that the limit value is not exceeded, the detection section 6 checks whether or not any of the area substitution factors exceeds the critical value (step S211).

When it is determined at step S211 that the critical value is exceeded, the area decode management section 9 updates the area substitution table for the area substitution information (step S212) so that the status flag is set to indicate the IDLE execution. The process then terminates.

When it is determined at step S211 that the critical value is not exceeded, the MPU 5 checks if an error occurs in the semiconductor memory (step S213). If no error occurs, the process terminates.

When it is determined at step S213 that an error occurs in the semiconductor memory, the detection section 6 rechecks if any of the area substitution factors exceeds the limit value (step S214). When the limit value is exceeded, the detection section 6 executes the process at steps S207 through S210.

The process determines the critical value and the limit value at the steps before and after step S213 for the error determination. This is because there may occur a substitution factor during command execution e.g., the current value or the substitute free area in FIG. 5) or a substitution factor due to error contents (e.g., the successive retry error in FIG. 5).

When it is determined at step S214 that the limit value is not exceeded, the detection section 6 determines whether or not any of the area substitution factors exceeds the critical value (step S215). When the critical value is exceeded, the detection section 6 executes the process at step S212.

When it is determined at step S215 that the critical value is not exceeded, the detection section detects the retry count (see the successive retry error in FIG. 5) at step S216. When the retry count is greater than or equal to the "preset value minus one", the error process is executed (step S217).

When the retry count is smaller than the "preset value minus one", the retry count is incremented by one (step S218) The process then restarts from step S205.

The following describes operations of a command process in the emergency condition of the memory card 1 with reference to a flowchart in FIG. 9.

In the emergency condition, the MPU 5 determines whether or not the automatic substitution mode is enabled (step S301). When the automatic substitution mode is not enabled, the MPU determines whether or not the command is allowed for the emergency condition (step S302). In this example, a command to write or erase the semiconductor memory is assumed to be the command allowed for the emergency condition. Further, it may be preferable to limit the other commands.

When it is determined at step S302 that the command is allowed for the emergency condition, it is further determined whether or not the command is an area substitution command (step S303). When the command is an area substitution command, the area substitution process is executed (step S304).

When it is determined at step S303 that the command is not an area substitution command, the other commands are processed (step S305). It is checked whether or not an error occurs in the semiconductor memory (step S306). When no error occurs, the process terminates. When an error occurs, the error is processed (step S307) to terminate the process.

When it is determined at step S301 that the automatic substitution mode is enabled, the notification section 7 notifies the outside such as the host (step S308) that the emergency condition is effective and the substitution is in process. Then, the process at step S304 is executed.

The following describes operations of a command process during IDLE execution for the memory card 1 with reference to a flowchart in FIG. 10.

The area decode management section 9 determines whether or not the area substitution destination is already retrieved (step S401). When the area substitution destination is already retrieved, it is determined whether or not the area substitution destination is substituted (step S402). When the area substitution destination is not substituted, the command is processed at the substitution destination (step S403).

When it is determined at step S402 that the area substitution destination is substituted, the command is processed at the substitution origin (step S404).

When the area substitution destination is not retrieved at step S401, MPU 5 retrieves the area substitution destination (step S405). When the substitution destination is available at step S406, the process is executed at step S402 and S403. When the substitution destination is unavailable at step S406, the error process is executed at step S407.

The following describes a process during IDLE execution for the memory card 1 with reference to a flowchart in FIG. 11.

During IDLE execution, the MPU 5 detects whether or not there is an interrupt request such as a write or read command from the host (step S501). When there is no interrupt request, the MPU 5 detects whether or not the status flag (FIG. 4) is set to IDLE execution (step S502).

When the status flag is set to IDLE execution at step S502, the area substitution process is executed (step S503). When the status flag is not set to IDLE execution, the process returns to step S501.

When an interrupt request is found at step S501, an area substitution in-process history is stored in a work area of the MPU 5 (step S504). Then, the interrupt-requesting command is processed (step S505).

The area substitution in-process history will now be described with reference to FIG. 12.

FIG. 12(a) is an explanatory diagram showing a configuration example of the area substitution in-process history that is used as one of pieces of area substitution information and is stored in area substitution information storage areas of the semiconductor memories $3_1$ and $3_2$.

The area substitution in-process history comprises a data section and a management section. The data section stores a plurality of history tables. The history table comprises a physical area number, a start address of substituted area, an end address of substituted area, and a redundant area.

The physical area number indicates to which physical area number the history data corresponds. The start address of substituted area and the end address of substituted area indicate a substituted area. The redundant area is used to add, e.g., an ECC redundant code but may be omitted.

The management section stores valid flags corresponding to respective history tables and indicates whether or not the corresponding history table is valid. History table [1] corresponds to valid flag [1]. The valid flag is set to 'FFh' when data is written. It is set to '00h' when no data is written.

Therefore, valid data belongs to the last table that contains the valid flag set to 'FFh'.

If a specific area is subject to repeated rewriting or erasing of the history tables and valid flags, a cell in a sector at a specific address is deteriorated. It is necessary to relax an increase in the number of rewrite operations at a specific address in the semiconductor memory due to history updates. For this purpose, eight additional write operations and data storage addresses are changed to disperse the number of erasures (rewrite operations).

In FIG. 12(a), the process writes data to history table [9] at address 'n+1', and then clears data at address 'n' where data has been written most recently. Instead, it may be preferable to clear a plurality of blocks at a time.

FIG. 12(b) exemplifies a configuration of the area substitution in-process history stored in the work area of the MPU 5.

In this case, the area substitution in-process history comprises a valid table, a physical area number, a start address of substituted area, and an end address of substituted area.

The valid table indicates a valid history table number instead of the valid flag. The physical area number, the start address of substituted area, and the end address of substituted area are the same as those of the area substitution in-process history stored in the area substitution information storage areas of the semiconductor memories $3_1$ and $3_2$.

An area substitution process in the memory card 1 will now be described with reference to a flowchart in FIG. 13.

The area decode management section 9 determines whether or not an area substitution destination is already retrieved (step S601). When no area substitution destination is retrieved, the area decode management section 9 retrieves an area substitution destination (step S602). When an area substitution destination is retrieved, the process at steps S604 through S607 (to be described) is executed.

When an area substitution destination is detected at step S603, the area substitution processing section 8 substitutes the area and saves data and the area decode management section 9 updates area substitution in-process history (step S604).

In the process at step S604, the area substitution saves data by copying the data from the substitution origin to the substitution destination. When the data contains a correctable error, the error correction is executed. When the error is uncorrectable, the data is copied as is. When the data is substituted in a substitution area at the area substitution origin, the data is copied to the area substitution destination based on the original user area address.

With respect to the area substitution in-process history, only data in the work area of the MPU 5 is updated. Data is written to the semiconductor memories $3_1$ and $3_2$ periodically or at each update.

The MPU 5 checks whether or not the area substitution terminates normally (step S605). When the area substitution terminates abnormally, the process is repeated from step S602.

When the area substitution terminates normally, the area decode management section 9 updates the area substitution information (step S606). The notification section 7 notifies the outside such as the host that the area substitution has been executed (step S607). No notification is made when the status flag indicates the IDLE execution. An error is notified when no substitution destination is available.

When no area substitution destination is detected at step S603, the process ate steps S606 and S607 is executed.

In this manner, the embodiment can detect, notify, and save an abnormal area in the semiconductor memories $3_1$ through $3_5$.

The areas are configured at physical boundaries controlled by the individual control sections and are saved by avoiding faulty locations including the individual control sections. Consequently, it is possible to greatly improve the reliability of the memory card 1.

While there have been described specific preferred embodiments of the present invention made by the inventors, it is to be distinctly understood that the present invention is not limited thereto but may be otherwise variously embodied within the spirit and scope of the invention.

The same value may be predetermined for both the critical value and the limit value. Either the critical value or the limit value may be predetermined. When only the critical value is predetermined, only a process to detect the critical value is executed. When the same value is predetermined for both the critical value and the limit value, or when only the limit value is predetermined, only a process to detect the limit value is executed.

The specification of the critical value and the limit value is permanently stored as ROM or a circuit in the controller. Alternatively, the specification thereof may be provided as firmware in the flash memory so as to be changeable according to a predetermined procedure. The predetermined value may be loaded into the controller during a reset process, for example.

Figure 14:
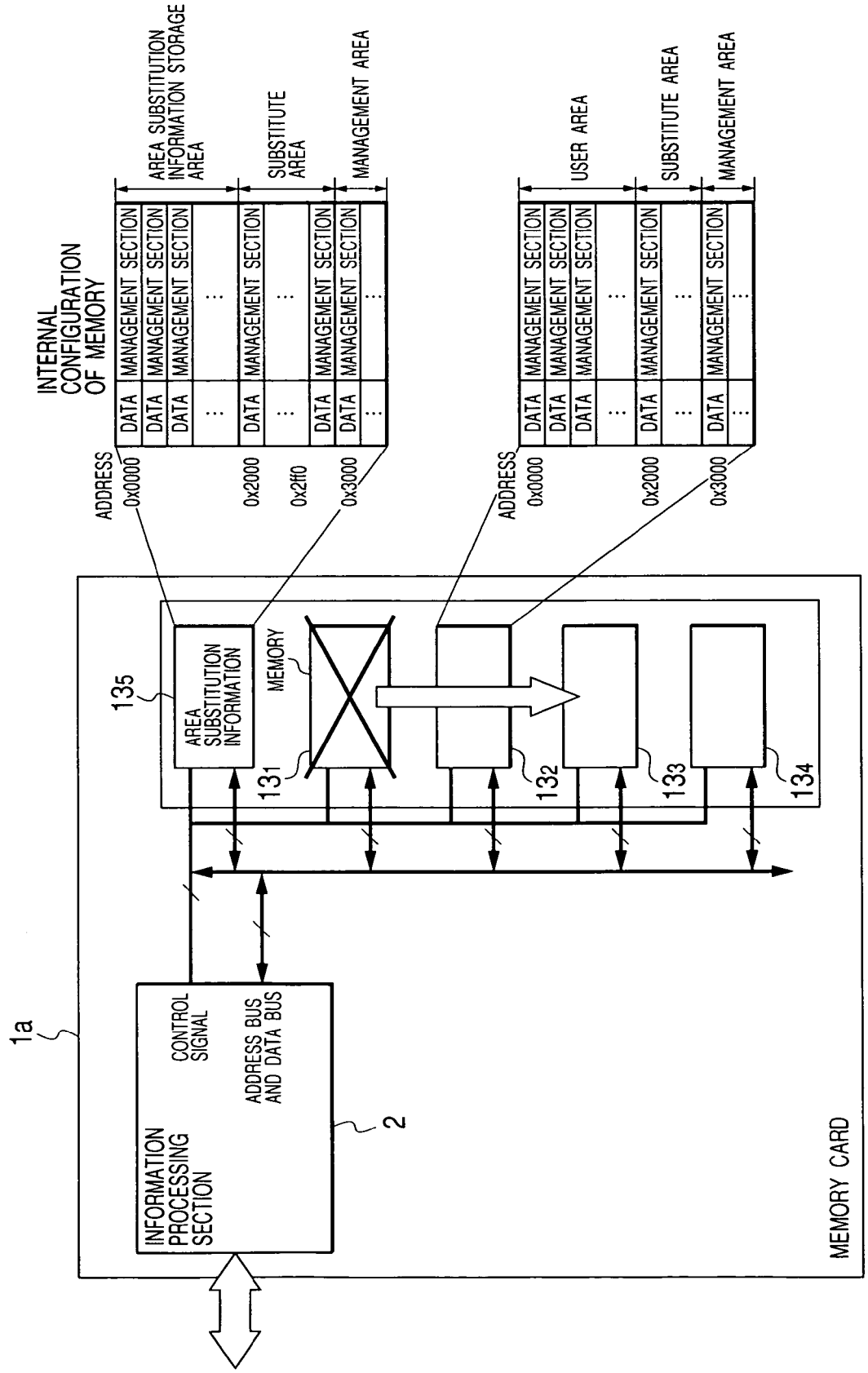
FIG. 14 is a block diagram of the memory card according to another embodiment of the present invention.

According to the configuration of the above-mentioned embodiment, the area substitution information is stored in the generally used semiconductor memory having the user area. As shown in FIG. 14, for example, it may be preferable to provide special semiconductor memory $13_5$ dedicated to store only the area substitution information in addition to the generally used semiconductor memories $13_1$ through $13_4$ to configure a memory card (storage device) 1a.

In this case, the inside of the semiconductor memory $13_5$ comprises: an area substitution information storage area to store the area substitution information; a substitution area to be substituted when the user area fails; and a management area to manage the substitution information.

This configuration can unify the area substitution information, making it possible to provide easy management of the area substitution information.

Further, it may be preferable to provide the host or the information processing section with an area (semiconductor memory) to store the area substitution information. Providing the host with the area can simplify processes for the memory card. It is possible to easily diversify processes under control of the OS (Operating System) and drivers.

Providing the information processing section with the area can submit area substitution processes to the hardware, making it possible to further accelerate processes.

Figure 15:
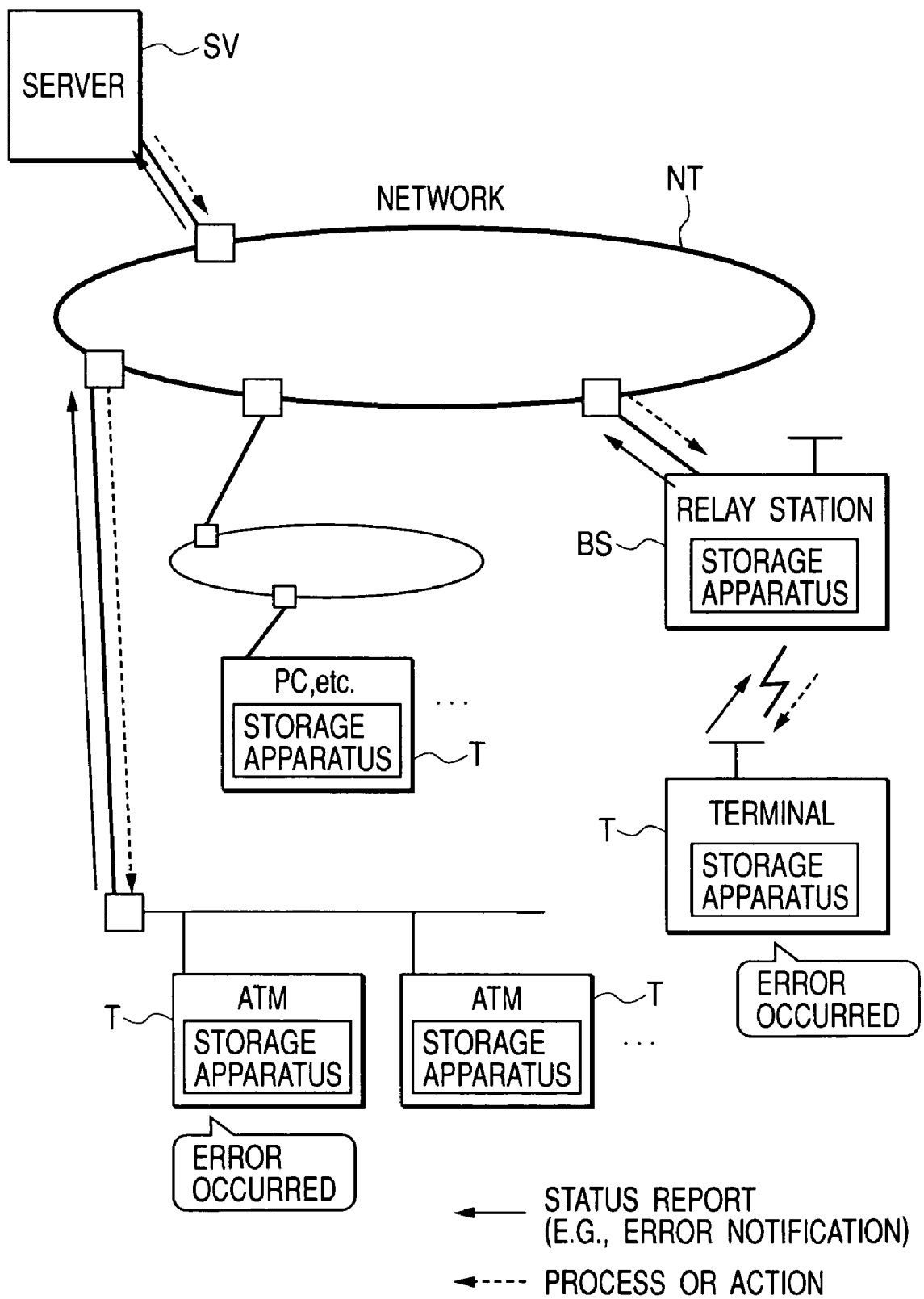
FIG. 15 is an explanatory diagram exemplifying a system configuration for managing area substitution information via a network according to another embodiment of the present invention.

Moreover, the storage device such as a memory card may be configured as shown in FIG. 15. According to this configuration, a plurality of terminals T is connected to each other via a network NT or a wireless communication. It may be preferable to notify and save the area substitution information that is notified and detected via the network NT.

The terminal T here is not limited especially and may be personal computers, ATMs (Automatic Teller Machines) at banks, PDAs (Personal Digital Assistants), or any other equivalents having the storage device.

As shown in FIG. 15, a server SV may be used for centralized management. A relay station BS may be used for distributed management of processes.

This makes it possible to fast detect and correct an anomaly in the storage device provided for the remote terminal T.

Furthermore, as shown in FIG. 16, a storage device 14 may comprise an information processing section 15 and a storage section 16. The storage section 16 comprises a plurality of memory modules $16_1$ through $16_n$. The memory modules $16_1$ through $16_n$ comprise a plurality of semiconductor memories mounted on a printed wiring board.

In this case, the area substitution is managed in units of memory modules. For example, the memory module $16_2$ is substituted for the memory module $16_4$ as the area substitution. The memory module $16_2$ is identified as the substitution origin (faulty), is removed from a slot St, and is replaced by a new memory module. The area substitution information is stored or updated when a memory module is replaced, for example.

This makes it possible to greatly improve the maintainability of the storage device 14.

The following summarizes representative advantageous effects of the invention disclosed in this application concerned.

(1) When the semiconductor memory contains an abnormal area, that area is detected and substituted on two levels: the critical state and the limit state. It is possible to improve the reliability of the storage device.

(2) Physical areas are used for semiconductor memory areas to save data by avoiding faulty locations including peripheral circuits. It is possible to further improve the reliability of the storage device.

(3) Still further, it is possible to greatly improve the performance and the reliability of electronic devices comprising the storage device and the like owing to the advantages (1) and (2).

What is claimed is:

1. A storage device comprising one or more semiconductor memories and an information processing section which performs a first operation for reading data stored in the one or more semiconductor memories and a second operation for writing data to the one or more semiconductor memories in accordance with commands received from outside thereof,
wherein the information processing section detects an error state associated with an area in the semiconductor memory,
substitutes the area during an idle state in which operations are not being performed in response to the commands, when the error state is detected to be a critical state indicating that the area is usable but in a critical condition requiring substitution, and
substitutes the area immediately when the error state is detected to be a limit state indicating that the area is not usable.

2. The storage device according to claim 1,
wherein a factor for the information processing section to determine the critical state as the error state comprises one or more of an insufficiency of a substitute free area, a successive retry error, a time over of an erasure time or a program time, an erasure count, an over current of performing a read operation or a write operation, and a low current value of externally supplied power; and
wherein a factor for the information processing section to determine the limit state as the error state comprises one or more of an insufficiency of a substitute free area, a successive retry error, an ECC uncorrectable error at retention failure, a device code unreadable error, a time over of an erasure time or a program time, an erasure count, an over current of performing a read operation or a write operation, and a low current value of externally supplied power.

3. The storage device according to claim 2, and which is capable of independently setting the factors for the information processing section to determine the critical state and setting the factors for the information processing section to determine the limit state.

4. The storage device according to claim 3,
wherein a substitution destination area substituted by the information processing section is a free area in the semiconductor memory or semiconductor memory for substitution only.

5. The storage device according to claim 4,
wherein, when the substitution destination area is a free area in the semiconductor memory, the substitution destination area is a physical area controlled by an individual peripheral circuit which controls any of a plurality of sectors provided for a memory mat.

6. The storage device according to claim 5, wherein a decode method of the device substitutes only data in a substitution origin area for data in the substitution destination area, and after substitution, allows access to the substitution destination area instead of the substituted area, and allows access to an unsubstituted area in the same manner as before the substitution.

7. The storage device according to claim 1,
wherein the information processing section notifies an outside of an emergency condition when the error state is indicated to be the limit state.

8. The storage device according to claim 7, wherein one or more restricting operations, including inhibiting a write operation, are performed in the limit state.

9. The storage device according to claim 8,
wherein the information processing section copies data from the substitution origin area to the substitution destination area during the area substitution and corrects a correctable error if it is contained in the data.

10. The storage device according to claim 9, further comprising:
a detection circuit for detecting an area state;
a notification circuit for notifying the outside of a detection result and an area substitution state;
an area substitution circuit for performing area substitution; and
an area decode management circuit for managing permission or inhibition of access to areas.

* * * * *